United States Patent
Huang et al.

(10) Patent No.: US 9,391,085 B2
(45) Date of Patent: Jul. 12, 2016

(54) SELF-ALIGNED SPLIT GATE FLASH MEMORY HAVING LINER-SEPARATED SPACERS ABOVE THE MEMORY GATE

(71) Applicant: Taiwan Semiconductor Manufacturing Co., Ltd., Hsin-Chu (TW)

(72) Inventors: Wei-Hang Huang, Kaohsiung (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/454,872

(22) Filed: Aug. 8, 2014

(65) Prior Publication Data

US 2016/0043097 A1    Feb. 11, 2016

(51) Int. Cl.
| | |
|---|---|
| H01L 29/66 | (2006.01) |
| H01L 27/115 | (2006.01) |
| H01L 29/792 | (2006.01) |
| H01L 29/423 | (2006.01) |
| H01L 29/51 | (2006.01) |
| H01L 21/28 | (2006.01) |
| H01L 29/45 | (2006.01) |
| H01L 21/02 | (2006.01) |

(52) U.S. Cl.
CPC ...... *H01L 27/11568* (2013.01); *H01L 21/0217* (2013.01); *H01L 21/28282* (2013.01); *H01L 29/42344* (2013.01); *H01L 29/456* (2013.01); *H01L 29/513* (2013.01); *H01L 29/518* (2013.01); *H01L 29/665* (2013.01); *H01L 29/6656* (2013.01); *H01L 29/66833* (2013.01); *H01L 29/792* (2013.01)

(58) Field of Classification Search
None
See application file for complete search history.

(56) References Cited

U.S. PATENT DOCUMENTS

| | | | | |
|---|---|---|---|---|
| 6,531,734 B1* | 3/2003 | Wu | .................... | H01L 21/28273 257/315 |
| 7,767,522 B2* | 8/2010 | Toba | ................. | H01L 21/28282 438/257 |
| 8,395,203 B2* | 3/2013 | Chakihara | .......... | G11C 16/0466 257/316 |
| 8,891,316 B2* | 11/2014 | Seo | ..................... | G11C 16/0425 365/185.08 |
| 2009/0309153 A1* | 12/2009 | Yanagi | ............... | H01L 27/11568 257/324 |
| 2010/0054043 A1* | 3/2010 | Liu | ................... | H01L 21/28273 365/185.29 |
| 2013/0181273 A1* | 7/2013 | Charpin-Nicolle | | H01L 21/28273 257/314 |
| 2015/0155293 A1* | 6/2015 | Wu | ........................ | H01L 29/792 257/326 |

OTHER PUBLICATIONS

Matsubara, et al. "Highly Reliable 10ns MONOS Flash." Renesas Technology Europe GmbH. Jan. 10, 2008.

* cited by examiner

*Primary Examiner* — Marc Armand
*Assistant Examiner* — Younes Boulghassoul
(74) *Attorney, Agent, or Firm* — Eschweiler & Associates, LLC

(57) ABSTRACT

Some embodiments of the present disclosure relate to a split gate memory cell which includes a select gate and a memory gate. The select gate has a planar upper surface disposed over a semiconductor substrate and is separated from the substrate by a gate dielectric layer. The memory gate has a planar upper surface arranged at one side of the select gate and is separated from the substrate by a charge trapping layer. The charge trapping layer extends under the memory gate. A first spacer is disposed above the memory gate and is separated from the memory gate by a first dielectric liner. The first dielectric liner extends upwardly along an upper sidewall of the charge trapping layer; and source/drain regions are disposed in the semiconductor substrate at opposite sides of the select gate and the memory gate.

20 Claims, 13 Drawing Sheets

US 9,391,085 B2

SELF-ALIGNED SPLIT GATE FLASH MEMORY HAVING LINER-SEPARATED SPACERS ABOVE THE MEMORY GATE

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells having charge storage components. Common types of flash memory cells include stacked gate memory cells, two transistor memory cells and split gate memory cells. Compared to two transistor cells, split gate memory cells have a smaller area. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
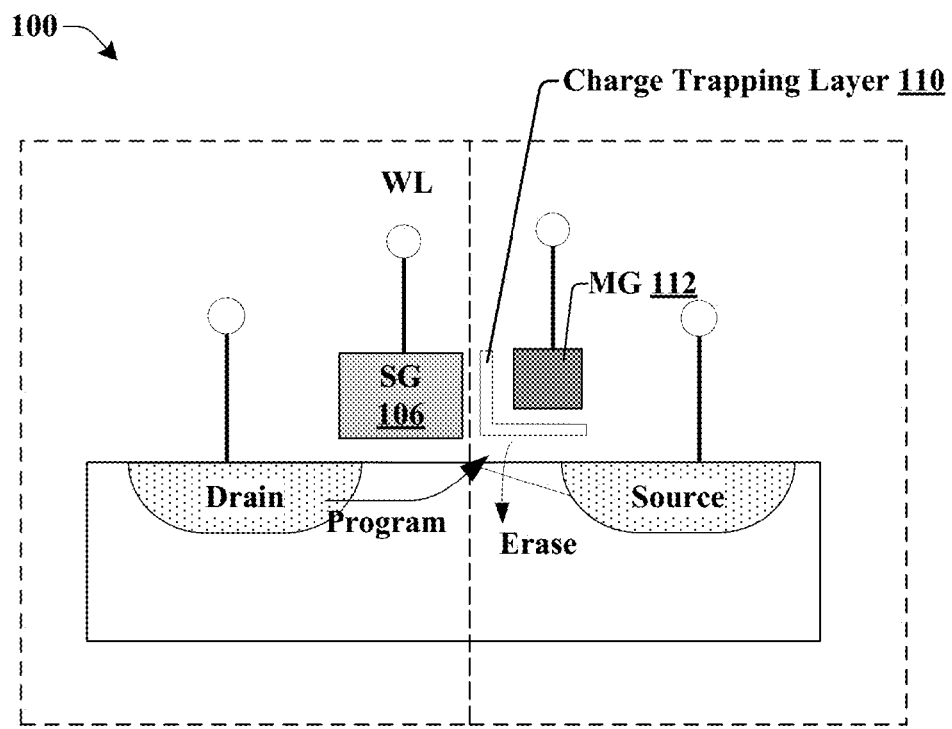
FIG. 1 illustrates a functional view of some embodiments of a split gate flash memory cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different devices, such as a memory cell array and a logic circuit, on the same wafer. The fabrication process of these integrate circuits (ICs) may include a chemical-mechanical polishing (CMP) process to planarize the structure. For example, High-k metal gate (HKMG) technology involves a replacement gate process, the CMP process is performed immediately before the polysilicon gates are removed, and planarizes the structure until a top surface of the logic gate structures is reached. In self-aligned flash memory cells, usually a self-aligned silicide (still known as "salicide") is formed on the base of the semiconductor surface in the active regions to provide electrical connection. This layer of salicide (self-aligned silicide) is also formed on top surfaces of the select gates (SGs) and the memory gates (MGs) during salicide formation on the base of the semiconductor surface. If self-aligned split-gate flash memory cells with salicide on top of the memory gate structures are embedded in the integrated circuits, the above mentioned CMP process may damage the ICs due to metal ions from the silicide contaminating other areas of the wafer/ICs as CMP occurs. Ultimately, this contamination can reduce manufacturing yields and render some ICs unusable or less than optimal.

On the other hand, the conventional process for fabricating flash memory usually uses photo masks to define and pattern the devices. Since the precision of the photo-masks is limited, misalignment can occur for features with dimensions less than some minimal line width design rule or spaced more closely than some minimal spacing design rule. This misalignment, if any, can lead to gaps between elements intended to be coupled together (e.g., undesired open circuits) and/or can lead to bridging between elements intended to be isolated (e.g., undesired short circuits), either of which can cause the flash memory device to fail. Therefore, density for conventional flash memory devices has been limited by these design rules.

Accordingly, the present disclosure relates to a new split gate memory cell structure and associated processing methods. To make it practical to integrate embedded flash memory with logic circuits, top surfaces of SGs and MGs are covered by spacers to prevent from silicide formation. Further, to pack flash cells closer together and define structures precisely, select gates (SGs) and memory gates (MGs) are self-aligned about these spacers. Therefore, when CMP is carried out, the top surfaces of the SGs and MGs (now lacking a salicide/silicide thereon) are still subject to a CMP operation to planarize the SGs and MGs top surfaces with other features on a periphery of the chip. However, because the top surfaces of the SGs and MGs no longer include the salicide/silicide, the CMP operation will not cause contamination for the periphery of the chip as in conventional approaches. Therefore, the resultant embedded flash memory and surrounding CMOS peripheral circuitry can be manufactured with higher yield and better reliability than previous approaches. In some embodiments, these self-aligned structures form a pair of flash cells sharing a common source/drain region. This process enables formation of symmetric structures with smaller critical dimensions and, hence, denser data storage.

FIG. 1 illustrates a functional view of some embodiments of a split gate memory cell 100. The split gate memory cell 100 comprises a select gate 106 and a memory gate 112 disposed laterally between source and drain regions. The select gate (SG) 106 is connected to a word line (WL) to control the access of the split gate memory cell. The memory gate (MG) 112 has a charge trapping layer 110 to act as a charge storage component. Charges (electrons) can be injected to the charge trapping layer 110 through a channel between the source and drain regions. A low voltage applied to the SG 106 pinches off the channel below the SG and enhances the lateral electric field used to heat the electrons. A high vertical electric field can be applied from the MG yielding a high injection or removal efficiency. The low SG voltage helps to minimize drain current during programming, which leads to a decrease of the programming power compared to standard one-transistor NOR memories.

Figure 2:
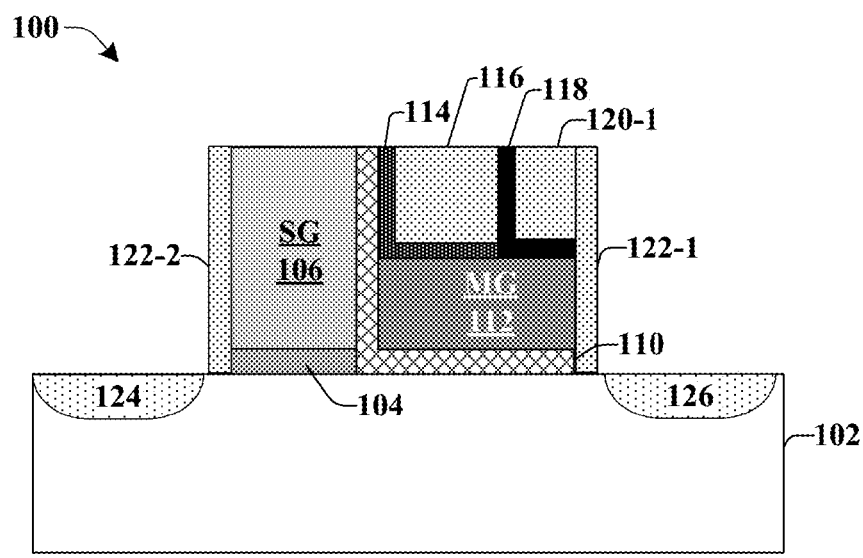
FIG. 2 illustrates a cross-sectional view of some embodiments of a split gate flash memory cell.

FIG. 2 shows a cross-sectional view of a semiconductor body that includes the split gate memory cell 100 in accordance with some embodiments. The split gate memory cell 100 resides over a semiconductor substrate 102. The split gate memory cell 100 comprises a select gate 106, a memory gate 112 and a charge trapping layer 110 that are arranged over a channel region separating source/drain regions 124, 126 of the memory cell 100. A lower surface of the select gate 106 is separated from an upper surface of the semiconductor substrate 102 by a gate dielectric layer 104. In some embodiments, the select gate 106 and memory gate 112 comprise doped poly silicon; however, in other embodiments the select gate 106 and the memory gate 112 can be made by other conductive materials such as metal, for example. In some embodiments, the charge trapping layer 110 comprises a first oxide layer, a nitride layer, and a second oxide layer or, which can be referred to as an oxide-nitride-oxide (ONO) structure. In some other embodiments, the charge trapping layer 110 comprises a first oxide layer, a layer of silicon dots, and a second oxide layer. During operation of the memory cell, the first and/or second oxide layers are structured to promote electron tunneling to and from the nitride layer or the silicon dots layer, such that the nitride layer or the silicon dots layer can retain trapped electrons that alter the threshold voltage of the cell in a manner that corresponds to a data state stored in the cell.

The charge trapping layer 110 is arranged between neighboring sidewalls of the select gate 106 and the memory gate 112 and extends under the memory gate 112. A first spacer 116 and a second spacer 120-1 are disposed over the memory gate 112. In some embodiments, a first dielectric liner 114 is disposed between sidewalls of the charge trapping layer 110 and the first spacer 116, and between a lower surface of the first spacer 116 and an upper surface of the memory gate 112. A second dielectric liner 118 is disposed between sidewalls of the first and second spacers 116 and 120-1, and between a lower surface of the second spacer 120-1 and the upper surface of the memory gate 112. A third spacer 122-1, 122-2 is disposed abut outermost side walls of the memory gate 112 and the select gate 106. In some embodiments, the charge trapping layer 110 and the first and second dielectric liners 114 and 118 are conformal layers having substantial constant thicknesses respectively. The spacers 116, 120 and 122 and dielectric liners 114 and 118 are disposed at positions not limited to those shown in FIG. 2; some alternative structures are also shown in FIGS. 3A-D.

FIGS. 3A-D show some cross-sectional views of a pair of split gate memory cells according to some embodiments. Take FIG. 3A as an example, as will be appreciated in greater detail below, a pair of split gate flash memory cells includes a first memory cell 301a and a second memory cell 301b that resides over the semiconductor substrate 102. The first and second memory cells 301a, 301b each comprises a gate structure 303a, 303b that is arranged over a channel region separating source/drain regions 124, 126 of the memory cell 100. Thus, the first memory cell 301a includes a first memory gate structure 303a arranged between a first source/drain region 126a and a second source/drain region 124; and the second memory cell 301b includes a second memory cell gate structure 303b arranged between the second source/drain region 124 and a third source/drain region 126b. The second source/drain region 124 thus acts as a shared or common source/drain (S/D) region for the first and second memory cells 301a, 301b.

The memory gate structures 303 are made of several substructures, including select gates 106, memory gates 112, and charge trapping layers 110, and have a select gate lower surface that is separated from an upper surface of the semiconductor substrate by a gate dielectric layer 104. More particularly, the first memory cell gate structure 303a comprises a first select gate (SG) 106a and a first memory gate (MG) 112a; and the second memory cell gate structure 303b comprises a second SG 106b and a second MG 112b. Notably, the first and second MGs 112a, 112b and the first and second SGs 106a, 106b have a flat top surface. A charge trapping layer 110a, 110b is arranged between neighboring sidewalls of each of the first and second SGs 106a, 106b and each of the first and second MGs 112a, 112b; and extends under each of the first and second MG 112a, 112b. The first and second memory cells 301a and 301b have symmetrical structures away from the second source/drain region 124. For simplification purpose, only structure of one (e.g. the first memory cell 301a) of the pair of memory cells is illustrated below, but it is appreciated that the second memory cell 301b may have substantially same structure symmetrical to the first memory cell 301a.

Figure 3A:
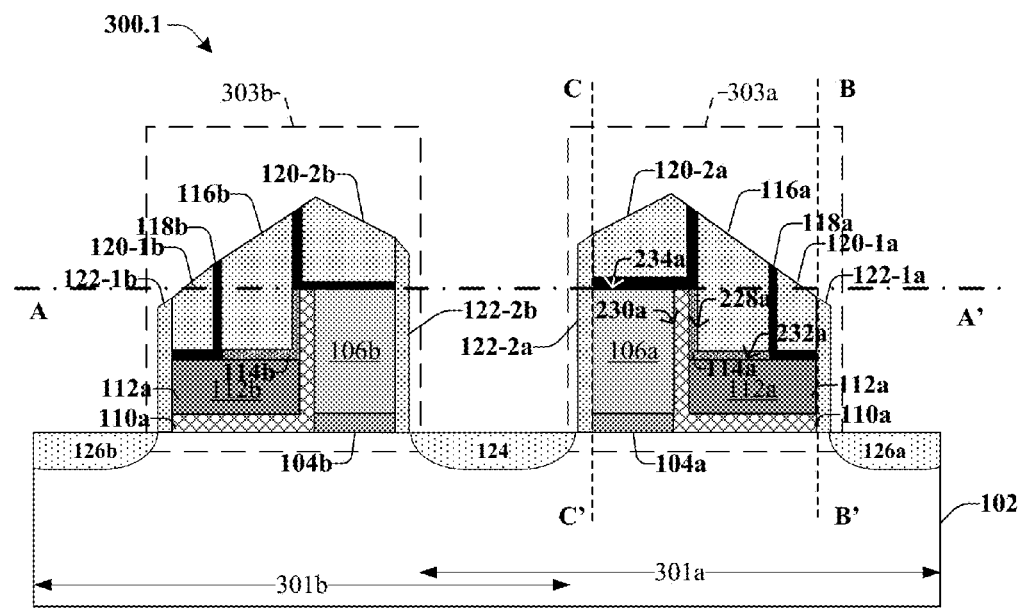
FIGS. 3A-D illustrate some cross-sectional views of some embodiments of a pair of split gate memory cells.

In FIG. 3A, a first spacer 116a and second spacer 120-1a are arranged directly above the MG 112a. A select gate spacer 120-2a is arranged directly above SG 106a. An outer sidewall of the second spacer 120-1a is aligned with an outer sidewall of the MG 112a along a line B-B'. An inner sidewall of the select gate spacer 120-2a is aligned with an inner sidewall of the SG 106a along a line C-C'. The outer sidewall of the second spacer 120-1a and the inner sidewall of the select gate spacer 120-2a are covered by a third spacer 122a (122-1a, 122-2a). In some embodiments, a first liner 114a is disposed between an upper sidewall 230a of the charge trapping layer 110a and a lower sidewall 228a of the first spacer 116a. The first liner 114a extends under the first spacer 116a abutting a portion of a top surface 232a of the MG 112a. A second liner 118a is disposed between the first spacer 116a and the second spacer 120-1a and the select gate spacer 120-2a, extending under the second spacer 120-1a and the select gage spacer 120-2a, abutting a remaining portion of the top surface 232a of the MG112a and a top surface 234a of the SG106a. In some embodiments, the first gate spacer 116a, the second spacer 120-1a and select gate spacer 120-2a comprise silicon nitride ($Si_3N_4$), and the first and second liners can be conformal liners comprising silicon dioxide ($SiO_2$).

Figure 3B:
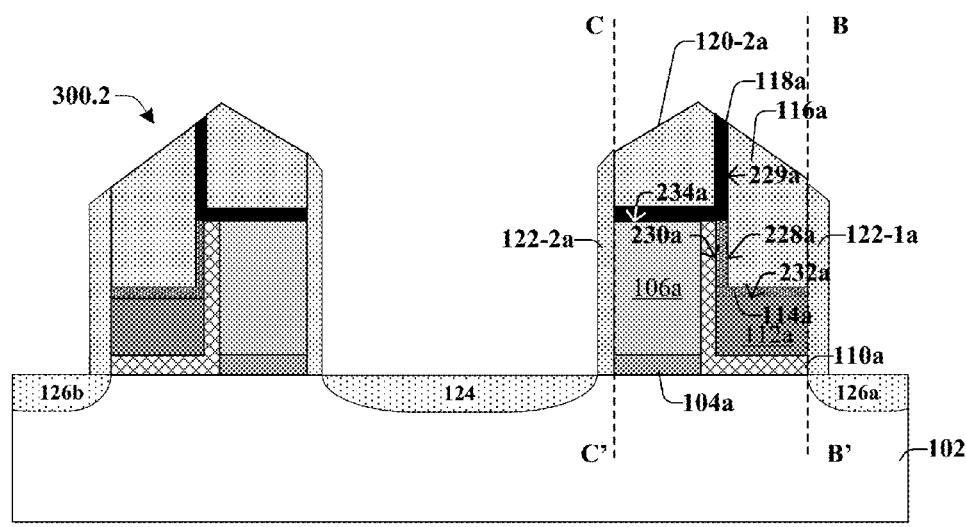

FIG. 3B shows an alternative structure of a pair of split gate memory cells 300.2 according to some other embodiments. In FIG. 3B, the first spacer 116a is arranged directly above the MG 112a and cover the top surface 232a of the MG 112a. An outer sidewall of the first spacer 116a is aligned with an outer sidewall of the MG 112a along a line B-B'. The select gate spacer 120-2a is arranged directly above the SG 106a. An inner sidewall of the select gate spacer 120-2a is aligned with an inner sidewall of the SG 106a along a line C-C'. The outer sidewall of the first spacer 116a and the inner sidewall of the select gate spacer 120-2a are covered by a third spacer 122a (122-1a, 122-2a). In some embodiments, the first liner 114a is disposed between an upper sidewall 230a of the charge trapping layer 110a and a lower sidewall 228a of the first spacer 116a. The first liner 114a extends under the first spacer 116a abutting the top surface 232a of the MG 112a. A second liner 118a is disposed between an upper sidewall 229a of the first spacer 116a and a sidewall of the select gate spacer 120-2a, extending under the select gate spacer 120-2a, abutting a top surface 234a of the SG 106a.

Figure 3C:
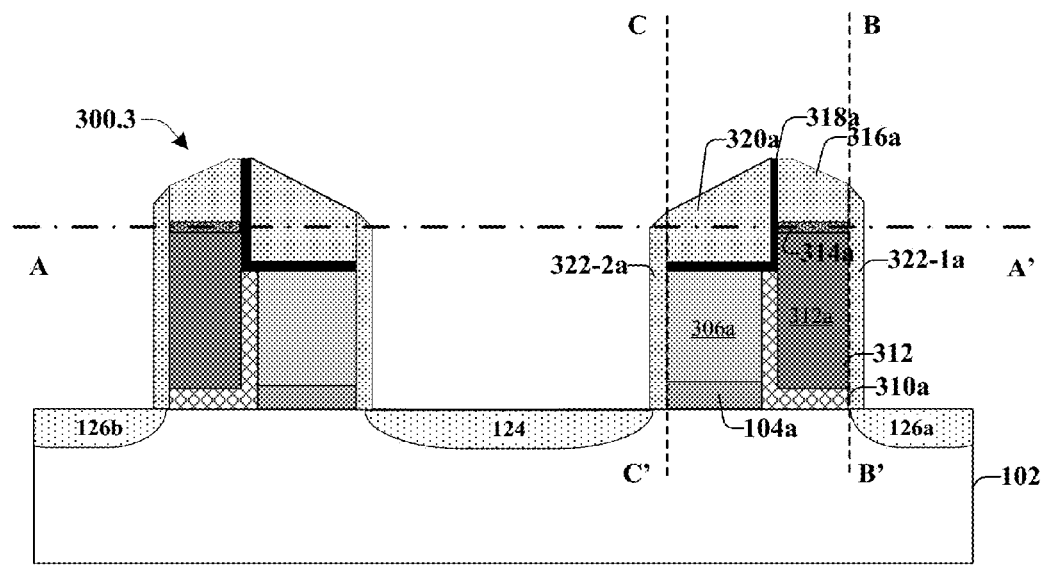

FIG. 3C shows an alternative structure of a pair of split gate memory cells 300.3 according to some other embodiments. In FIG. 3C, different from shown in FIGS. 3A-B in which the select gate (SG)106a has a height that is larger than that of the memory gate (MG) 112a, a select gate (SG) 306a has a height that is smaller than a height of a memory gate (MG) 312a. A first spacer 316a is arranged directly above the MG 312a and cover a top surface of the MG 312a. An outer sidewall of the first spacer 316a is aligned with an outer sidewall of the MG 312a along a line B-B'. A select gate spacer 320a is arranged directly above the SG 306a. An inner sidewall of the select gate spacer 320a is aligned with an inner sidewall of the SG 306a along a line C-C'. The outer sidewall of the first spacer 316a and the inner sidewall of the select gate spacer 320a are covered by a third spacer 322a (322-1a, 322-2a). In some embodiments, the first liner 314a is disposed abutting the top surface of the MG 312a and a bottom surface of the first spacer 316a. A second liner 318a is disposed under the select gate spacer 320a and between an upper sidewall of the MG 312a and a sidewall of the first spacer 316a. Similarly, in some embodiments, the first spacer 316a and the select gate spacer 320a comprise silicon nitride ($Si_3N_4$), and the first and second liners 314a and 318a can be conformal liners comprising silicon dioxide ($SiO_2$).

Figure 3D:
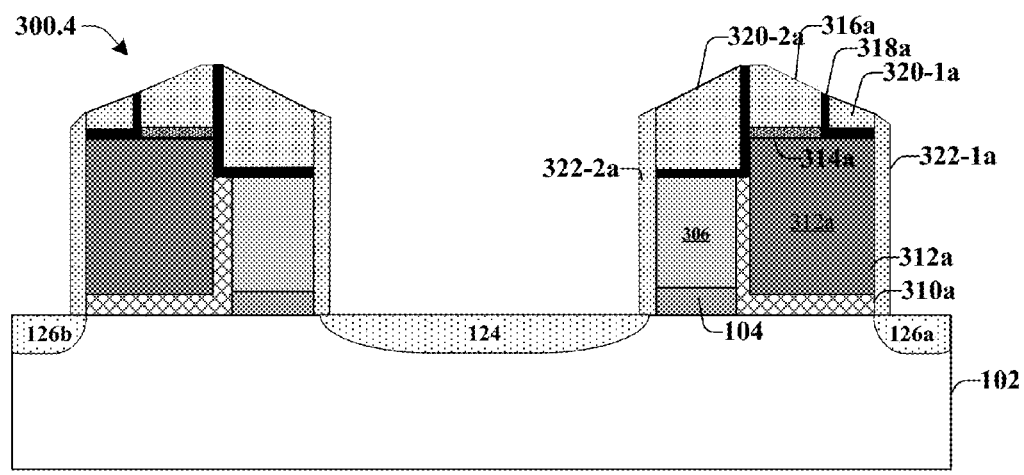

FIG. 3D shows an alternative structure of a pair of split gate memory cells 300.4 according to some other embodiments. In FIG. 3D, the SG 306a has a height that is smaller than a height of the MG 312a. Different from FIG. 3C, the top surface of the MG 312a is covered by a first spacer 316a and a second spacer 320-1a. The first and second spacers 316a and 320-1a are separated by a conformal dielectric liner disposed therebetween and extended under the second spacer 320-1a.

In FIGS. 3A-D, the spacers cover top surfaces of the MGs and SGs, preventing formation of silicide on the top surfaces of the MGs or SGs to limit or prevent metal ion contamination during a CMP process. The covered top surfaces of the SGs and MGs may be substantially flat without indentations. Notably, though FIGS. 3A-D show tapered top surfaces of the pair of split gate memory cells, these surfaces may be planarized by subsequent processes. For example, tapered top surfaces of FIG. 3A may be planarized by a CMP process reaching a flat lateral surface along a line A-A'. Remaining gate structure is similar to shown in FIG. 2. For the pair of split gate memory cells 300.3 in FIG. 3C, after a planarization process along a line A-A', remaining gate structure can have a portion of the select gate spacer 320a disposed over the SG 306a with a new flat top surface.

Figure 4:
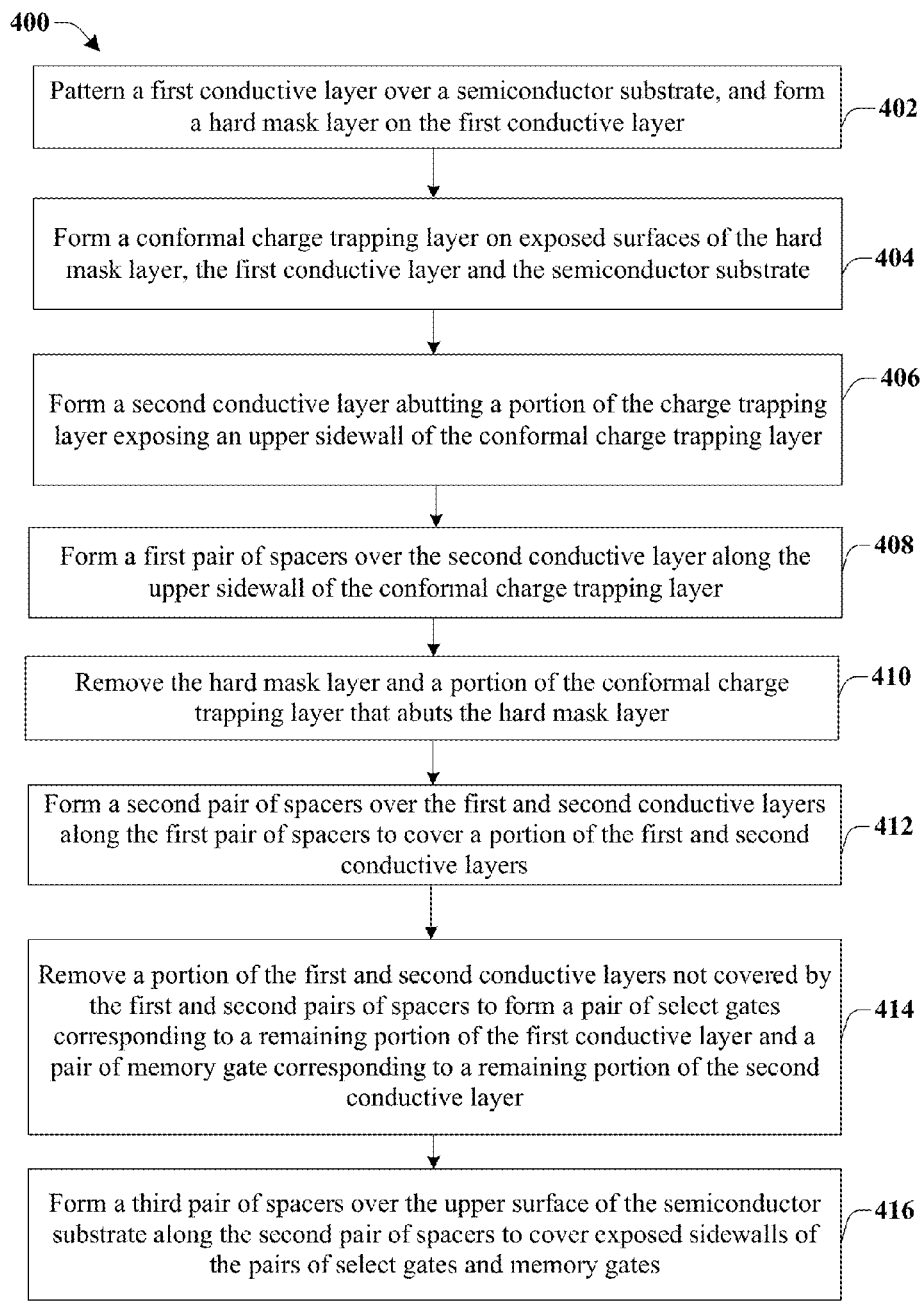
FIG. 4 illustrates a flow diagram of some embodiments of a method of forming a split gate memory cell.

FIG. 4 shows a flow diagram of a method 400 of forming a split gate memory cell according to some embodiments. While disclosed methods (e.g., method 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At Action 402, a first conductive layer is patterned over a semiconductor substrate, and a hard mask layer is formed on the first conductive layer. Sidewalls of the first conductive layer and hard mask layer extend upward from an upper surface of the semiconductor substrate to an upper surface of the hard mask layer.

At Action 404, a conformal charge trapping layer is formed on exposed surfaces of the hard mask layer, the first conductive layer and the semiconductor substrate. The conformal charge trapping layer is formed on the upper surface of the hard mask layer, along the hard mask sidewalls, along the first conductive layer sidewalls, and over the upper surface of the substrate.

At Action 406, a second conductive layer is formed abutting a portion of the charge trapping layer exposing an upper sidewall of the conformal charge trapping layer. The second conductive layer can be formed by depositing a conductive material first and then performing a planarization process followed by an etch back process. A portion of the conductive material is removed leaving the upper sidewall of the conformal charge trapping layer and the upper surface of the hard mask layer exposed so a remaining portion of the conductive material overlies the upper surface of the semiconductor substrate.

At Action 408, a first pair of spacers is formed over the second conductive layer along the upper sidewall of the conformal charge trapping layer. A conformal dielectric liner can be formed along surface topology before forming the first pair of spacers.

At Action 410, the hard mask layer and a portion of the conformal charge trapping layer that abutting the hard mask layer are removed. The removed portion of the conformal charge trapping layer is between the first pair of spacers. Upper inner sidewalls of each of the first pair of spacers are exposed.

At Action 412, a second pair of spacers is formed over the first and second conductive layers along the first pair of spacers to cover a portion of the first and second conductive layers. The second pair of spacers can comprise two portions. One portion is a pair of spacers disposed along the upper inner sidewalls of each of the first pair of spacers. Another portion is a pair of spacers disposed along outer sidewalls of each of the first pair of spacers.

At Action 414, a portion of the first and second conductive layers not covered by the first and second pairs of spacers is removed to form a pair of select gates corresponding to remaining portion of the first conductive layer and a pair of memory gate corresponding to remaining portion of the second conductive layer.

At Action 416, a third pair of spacers is formed over the upper surface of the semiconductor substrate along the second pair of spacers to cover exposed sidewalls of the pairs of select gates and memory gates.

FIGS. 5A-L show some cross-sectional views of a method of forming a pair of split gate memory cells according to some embodiments. Although FIGS. 5A-L are described in relation to method 400, it will be appreciated that the structures disclosed in FIGS. 5A-L are not limited to such a method.

Figure 5A:
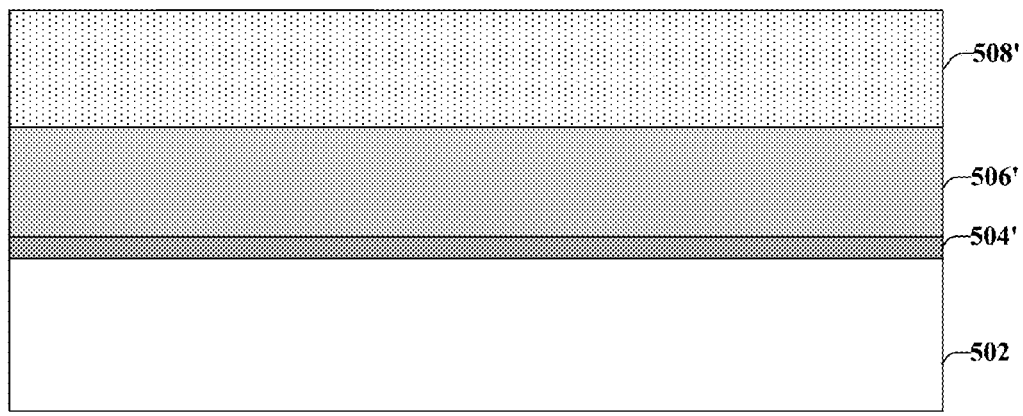
FIGS. 5A-L illustrate some embodiments of cross-sectional views of a method of forming a split gate memory cell.

As shown in FIG. 5A, a first dielectric material 504', a first conductive material 506' and a hard mask material 508' are formed in that order over a semiconductor substrate 502. The semiconductor substrate 502 is typically planar with a uniform thickness. Further, the semiconductor substrate 502 is n- or p-type, and can, for example, be a silicon wafer, such as a Si bulk wafer or a silicon-on-insulator (SOI) wafer. If present, an SOI substrate is often made up of an active layer of high quality silicon, which is arranged over a handle wafer and is separated from the handle wafer by a buried oxide layer. The first dielectric material 504' can be an oxide, such as silicon dioxide, or other high-k dielectric materials.

Figure 5B:
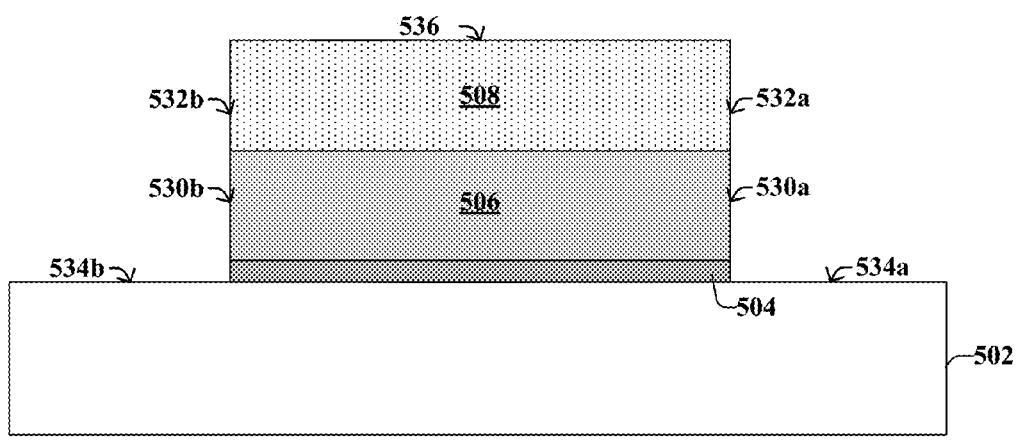

As shown in FIG. 5B, the first dielectric material 504', the first conductive layer 506' and the hard mask material 508' are patterned to form first dielectric layer 504, first conductive layer 506 and corresponding hard mask layer 508. Sidewalls 532, 530 of the hard mask layer 508 and the first conductive layer 506 extend upward from an upper surface 534 of the semiconductor substrate 502 to an upper surface 536 of the hard mask layer 508.

Figure 5C:
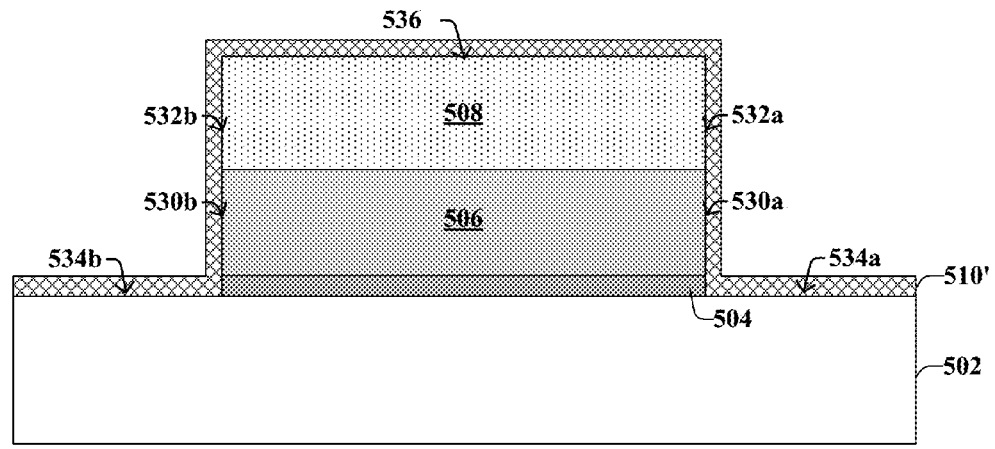

As shown in FIG. 5C, a conformal charge trapping layer 510 is formed on exposed surfaces (536, 532, 530 and 534) of the hard mask layer 508, the first conductive layer 506 and the semiconductor substrate 502. The conformal charge trapping layer 510 is formed on the upper surface 536 of the hard mask layer, along the hard mask sidewalls 532, along the first conductive layer sidewalls 530, and over the upper surface 534 of the substrate 502. In some embodiments, the conformal charge trapping layer 510 can be formed by plasma enhanced chemical vapor deposition (PECVD), and can be made up of multiple layers, such as a charge trapping layer sandwiched between two dielectric layers.

Figure 5D:
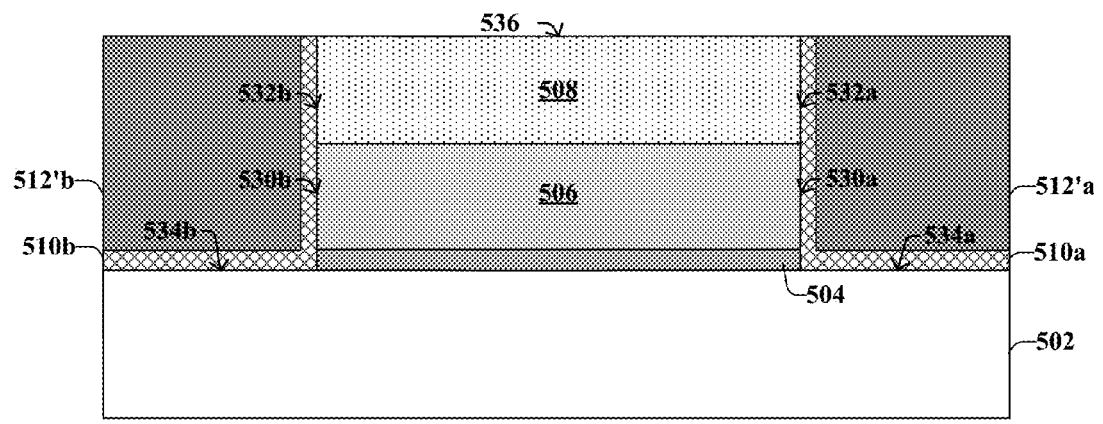

As shown in FIG. 5D, a second conductive material is formed on the charge trapping layer 510 and then planarized to leave a second conductive layer 512' formed abutting a portion of the charge trapping layer 510a, 510b formed on the sidewalls 530, 532 of the first conductive layer 506 and the hard mask layer 508 and the upper surface 534 of the substrate 502. The planarization process may remove a portion of the charge trapping layer disposed on the upper surface 536 of the hard mask layer 508. The second conductive layer 512' is formed symmetrically at both sides of the first conductive layer 506.

Figure 5E:
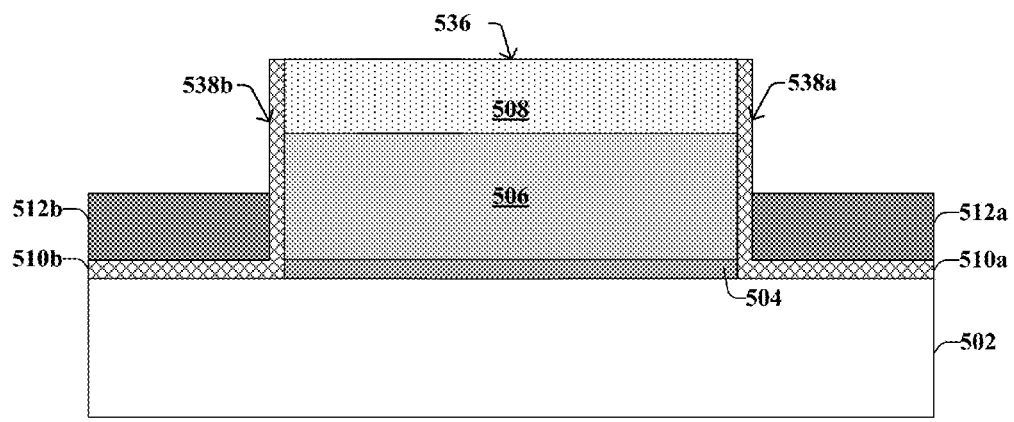

As shown in FIG. 5E, an etch back can be performed to remove a top portion of the second conductive layer 512', leaving two portions 512a and 512b of the second conductive layer at both sides of the structure overlies the upper surface 534 of the semiconductor substrate 502. An upper sidewall 538 of the conformal charge trapping layer 510 and the upper surface 536 of the hard mask layer 508 are exposed.

Figure 5F:
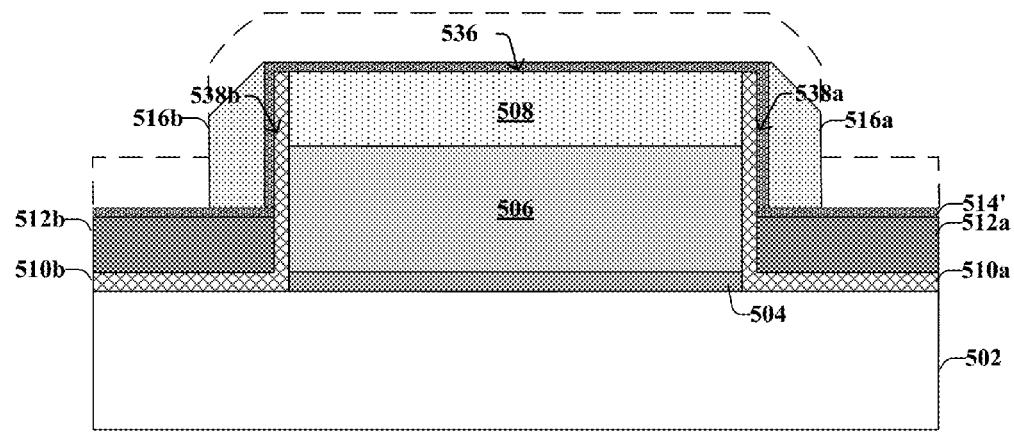

As shown in FIG. 5F, a first pair of spacers 516 (516a, 516b) is formed over the second conductive layer 512 along the upper sidewall 538 of the conformal charge trapping layer 510. In some embodiments, a first dielectric liner 514' can be formed from an upper surface of the second conductive layer 512 extending to the upper sidewall 538 and can cover the upper surface 536 before forming the first pair of spacers 516. The first dielectric liner 514' can act as an etch stop layer with relative high selectivity and enhance adhesion of the first pair of spacers 516. In some embodiments, a dielectric layer shown by dotted line is firstly formed along the first dielectric liner 514' and then etched to the first dielectric liner 514' underneath, forming the first pair of spacers 516.

Figure 5G:
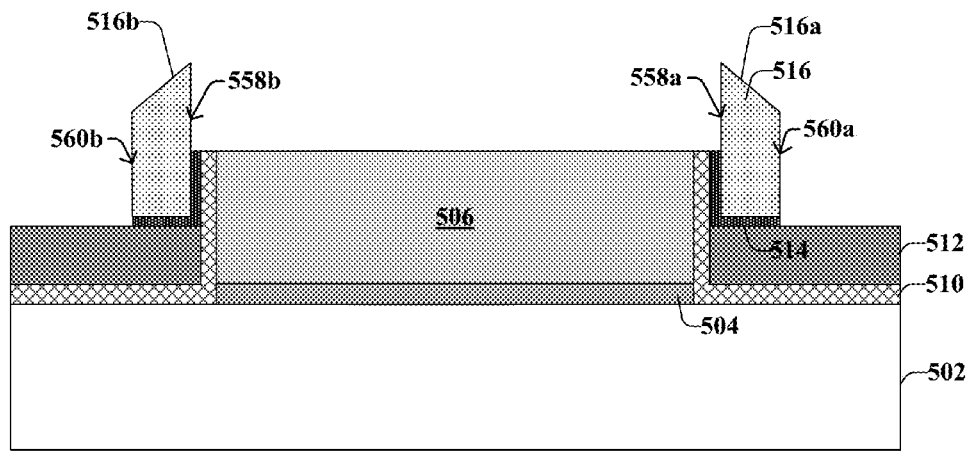

As shown in FIG. 5G, the hard mask layer 508 and a portion of the conformal charge trapping layer 510 abutting the hard mask layer 508 are removed. The removed portion of the conformal charge trapping layer is between the first pair of spacers 516. Upper inner sidewalls 558 of each of the first pair of spacers 516 are exposed. In some embodiments, the hard mask layer 508 and the portion of the conformal charge trapping layer 510 are etched off using wet etching.

Figure 5H:
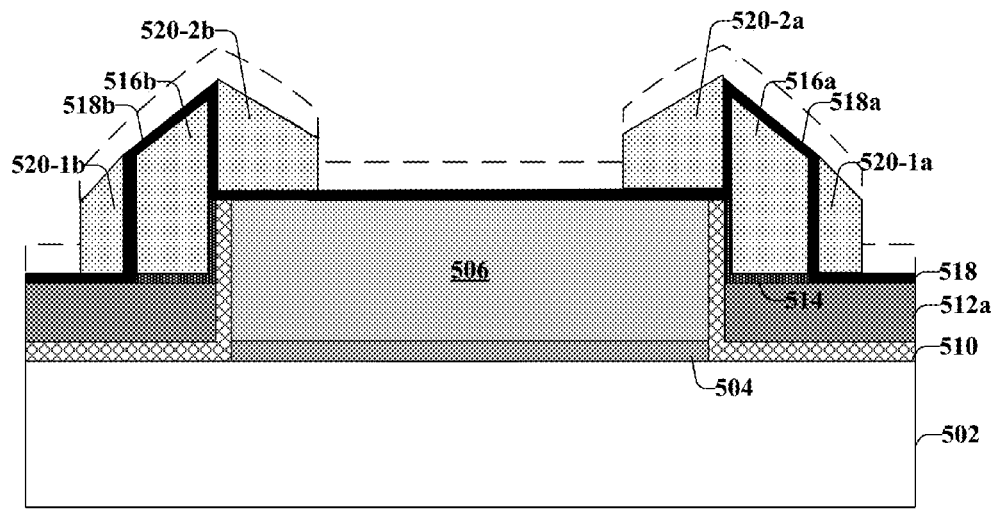

As shown in FIG. 5H, a second pair of spacers 520 is formed over the first and second conductive layers 506, 512 along both sides of the first pair of spacers 516. The second pair of spacers 520 can comprise two portions. A first portion is a pair of spacers 520-1 (520-1a, 520-1b) disposed along outer sidewalls 560 of each of the first pair of spacers 516. A second portion is a pair of spacers 520-2 (520-2a, 520-2b) disposed along the upper inner sidewalls 558 of each of the first pair of spacers 516. Similarly, in some embodiments, a second dielectric liner 518' can be formed from the exposed upper surface of the second conductive layer extending to the sidewall of each of the first pair of spacers 516 and cover an upper surface of the first conductive layer 506 before forming the second pair of spacers 520. The second dielectric liner 518' can act as an etch stop layer with relative high selectivity besides enhance adhesion of the second pair of spacers 520. In some embodiments, a second dielectric layer shown by dotted line is firstly formed along the second dielectric liner 518' and then etched to the second dielectric liner 518' underneath, forming the second pair of spacers 520-1 and 520-2.

Figure 5I:
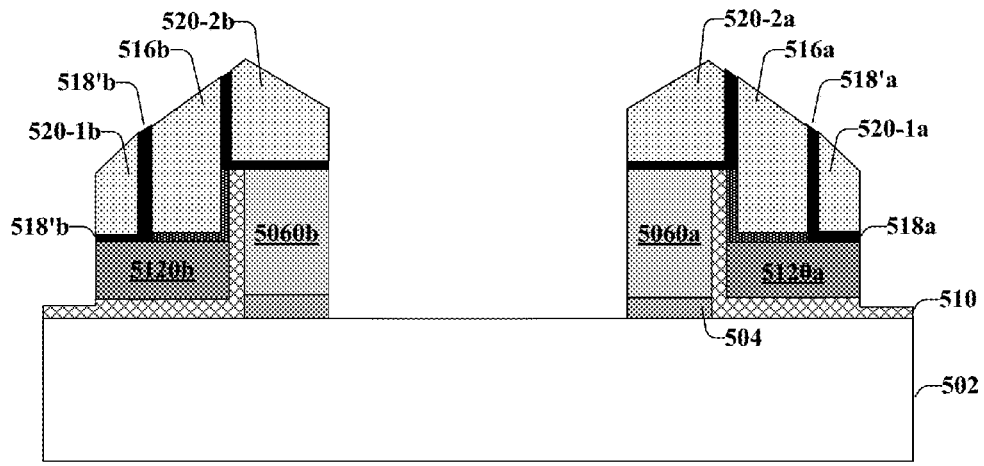

As shown in FIG. 5I, portions of the first and second conductive layers 506 and 512 and the gate dielectric layer 504 not covered by the first and second pairs of spacers 516 and 520 are removed to form a pair of select gates 5060 corresponding to remaining portion of the first conductive layer and a pair of memory gate 5120 corresponding to remaining portion of the second conductive layer. In some embodiments, the portions of the first and second conductive layers 506 and 512 are removed using dry etching. The portion of the gate dielectric layer can be removed by selective wet etching in order to protect the substrate 502 from damaging. In some embodiments, a portion of the charge trapping layer 510 comprising same material with the gate dielectric layer 504 is removed together with the gate dielectric layer 504. For example, the gate dielectric layer 504 can be made of silicon dioxide, and the charge trapping layer 510 can comprise an oxide layer on top which is also removed at this step.

Figure 5J:
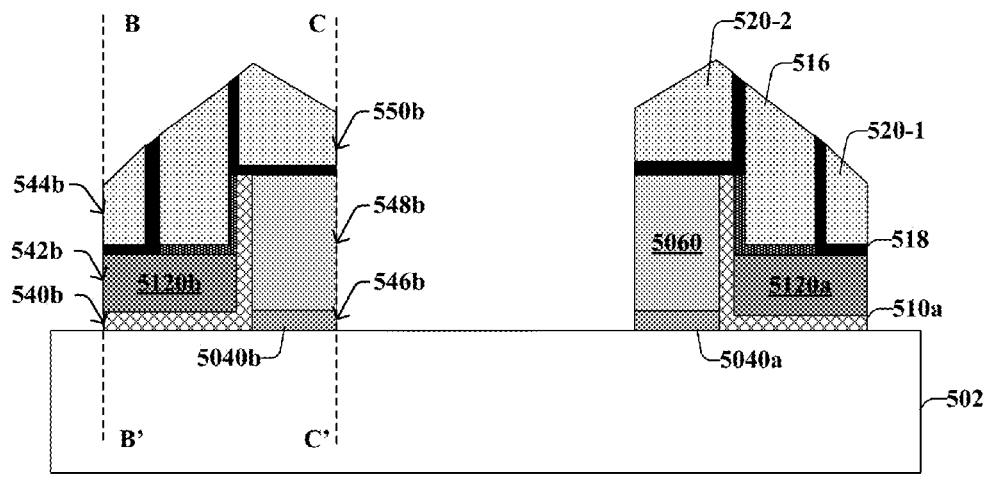

As shown in FIG. 5J, a portion of the charge trapping layer 510 not covered by the pair of the select gate 5060 or the pair of memory gate 5120 is removed. Outer sidewalls 540, 542, 544 of the charge trapping layer 510, the memory gate 5120, the first portion 520-1 of the second pair of spacers 520 at outer side are aligned. Inner sidewalls 546, 548, 550 of the gate dielectric layer 5040, the select gate 5060, the second portion 520-2 of the second pair of spacers at inner side are aligned. In some embodiments, the portion of the conformal charge trapping layer 510 are etched off using selective wet etching. In some embodiments, the charge trapping layer 510 comprises a silicon dot layer which can be oxidized first and removed together with an oxide layer disposed underneath the silicon dot layer.

Figure 5K:
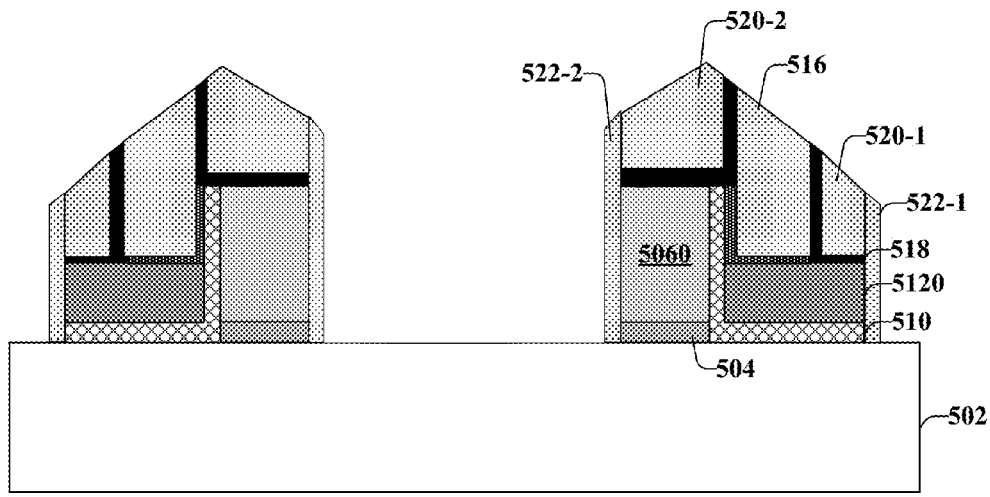

As shown in FIG. 5K, a third pair of spacers is formed over the upper surface of the semiconductor substrate 502 along outer sidewalls of the second pair of spacers 520-1, 520-2 to cover exposed sidewalls of the pairs of select gate 5060 and memory gate 5120. In some embodiments, source/drain regions are formed subsequently in the substrate, wherein the source/drain regions are arranged between inner sidewalls of the pair of the select gates 5060 and about outer sidewalls of the pair of the memory gates 5120. A silicide layer then can be formed directly on an upper region of the source/drain regions while the pairs of the select gates 5060 and memory gates 5120 are covered by the spacers 516, 520, 522 to prevent formation of silicide thereon.

Figure 5L:
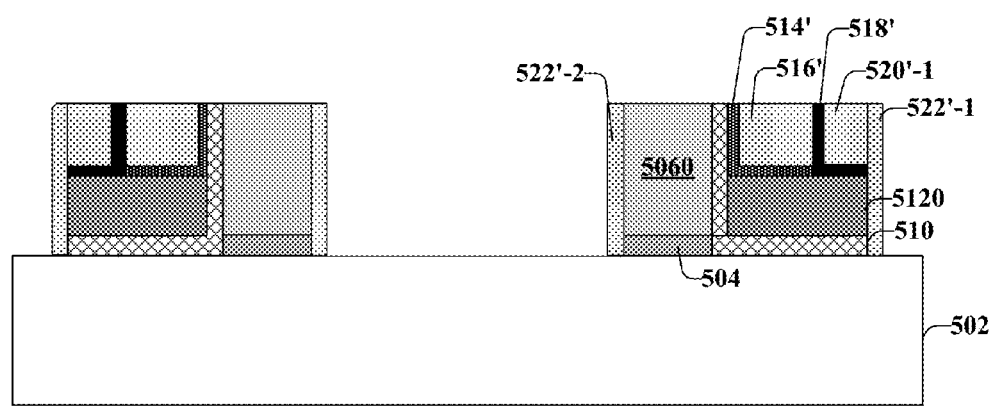

As shown in FIG. 5L, a chemical mechanical polishing (CMP) can be performed to planarize top surface of the structure.

FIGS. 6A-F show some alternative cross-sectional views of the method of forming a pair of split gate memory cells according to some other embodiments. Although FIGS. 5A-D followed by FIGS. 6A-F, are described in relation to method 400, it will be appreciated that the structures disclosed in FIGS. 6A-F are not limited to such a method.

Figure 6A:
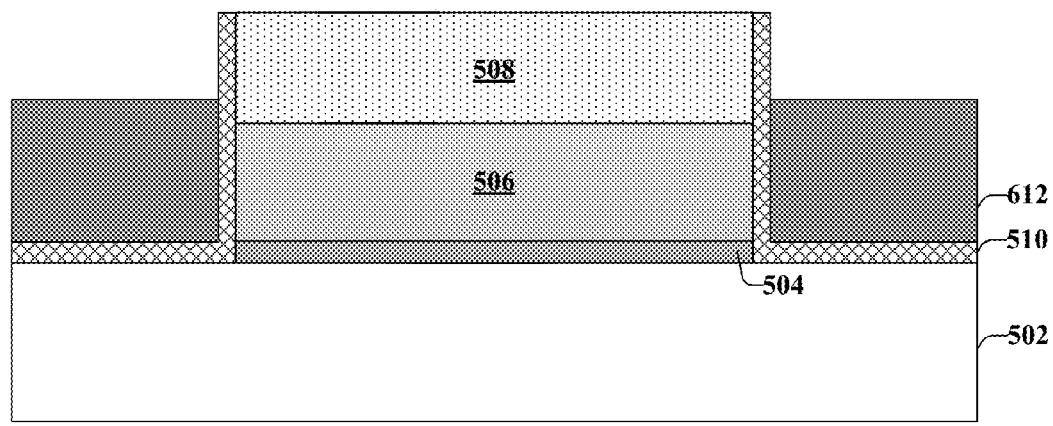
FIGS. 6 A-F illustrate some other embodiments of cross-sectional views of a method of forming a split gate memory cell.

As shown in FIG. 6A, which follows from the structure shown in FIG. 5D, the second conductive layer 512' is etched back to form a second conductive structure 612. The second conductive structure 612 has a height that is larger than a height of the first conductive layer 506.

Figure 6B:
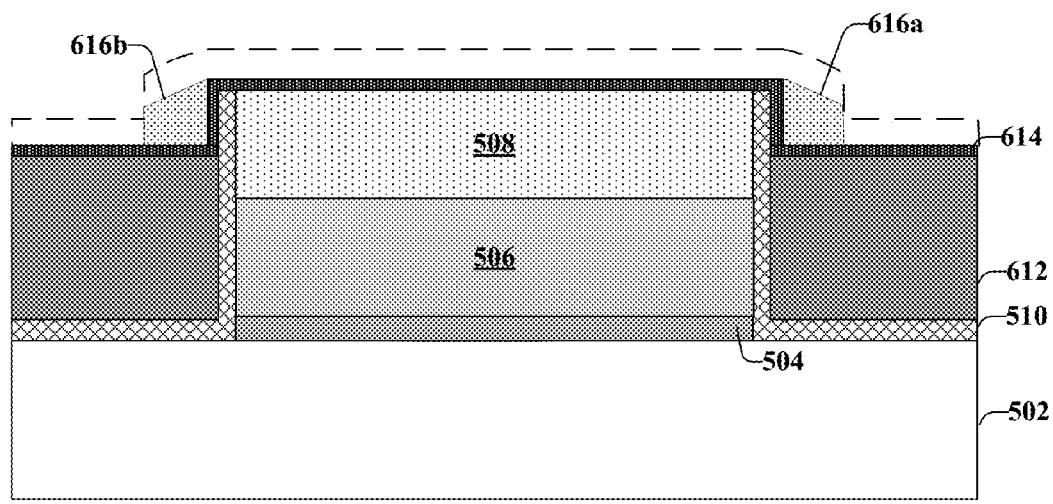

As shown in FIG. 6B, a first pair of spacers 616 is formed over the second conductive structure 612 along an upper sidewall of the charge trapping layer 510. Before forming the first pair of spacers 616, a first conformal dielectric liner 614 can be formed from an upper surface of the second conductive structure 612, along the upper sidewall of the charge trapping layer 510, extending upwardly to a upper surface of the hard mask layer 508.

Figure 6C:
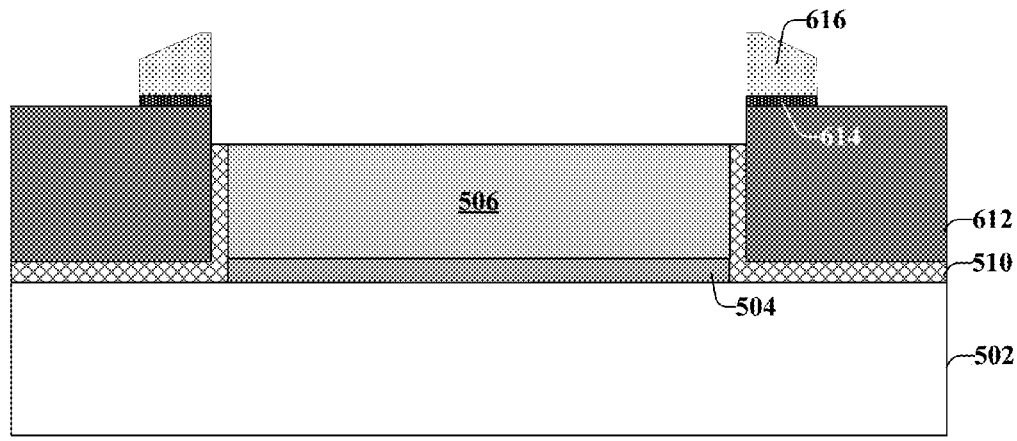

As shown in FIG. 6C, the hard mask layer 508 is removed together with an abutting portion of the charge trapping layer. A portion of the first dielectric liner 614 that is not covered by the first pair of spacers 616 is also removed.

Figure 6D:
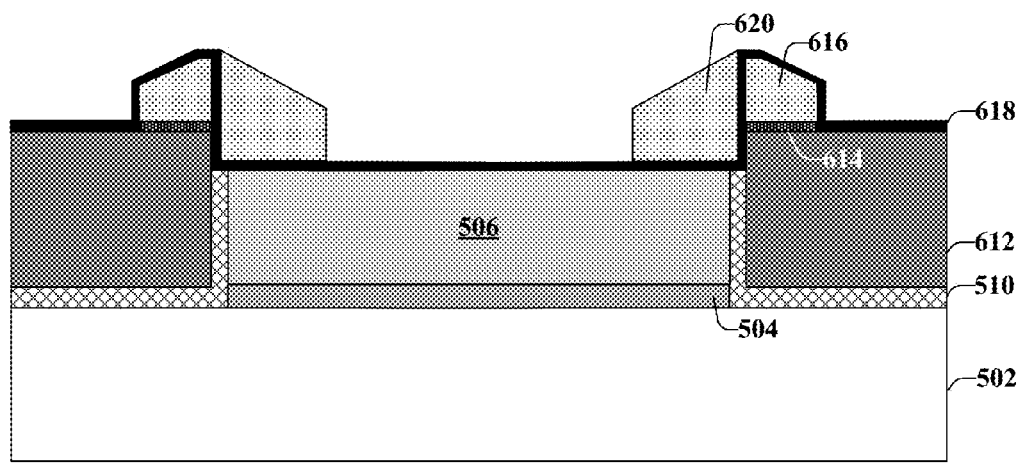

As shown in FIG. 6D, a second conformal dielectric liner 618 is formed along exposed surfaces and sidewalls of the first conductive layer 506, the second conductive structure 612, the first pair of spacers 616 and corresponding first dielectric liner 614. A second pair of spacers 620 is formed overlying the first conductive layer 506 along upper sidewalls of the second conductive structure 612 and inner sidewalls of the first pair of spacers 616.

Figure 6E:
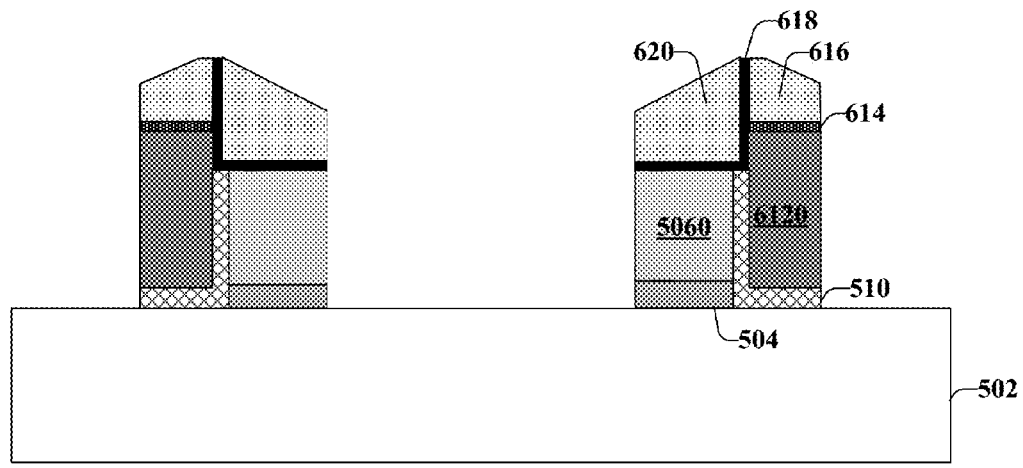

As shown in FIG. 6E, a portion of the first conductive layer 506, the second conductive structure 612 that is not covered by the first and second pairs of spacers 616 and 620 are removed together with corresponding portions of the charge trapping layer 510 and the gate dielectric layer 504. Pair of select gates 5060 corresponding to remaining portion of the first conductive layer 506 and pair of memory gate 5120 corresponding to remaining portion of the second conductive structure 612 are formed.

Figure 6F:
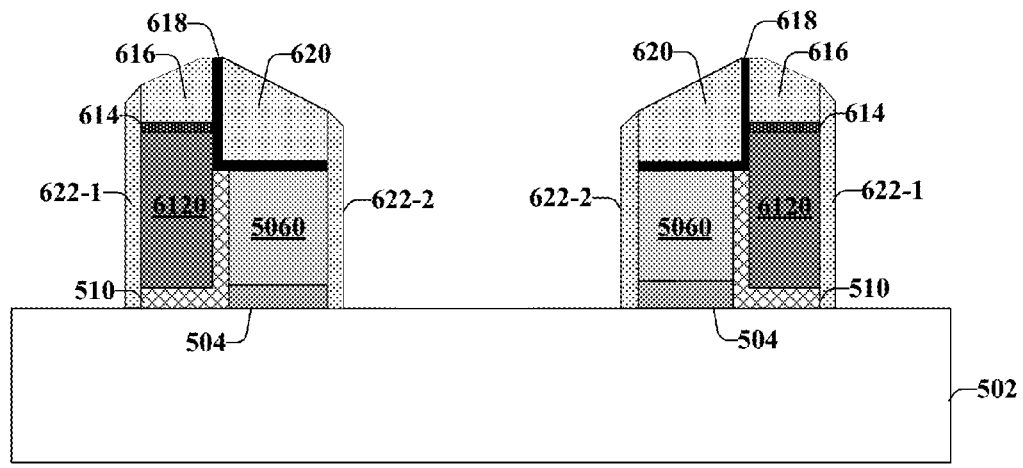

As shown in FIG. 6F, a third pair of spacers 622 is formed over the upper surface of the semiconductor substrate 502 along outer sidewalls of the first pair of spacers 616 to cover exposed sidewalls of the pairs of select gate 5060 and memory gate 5120.

Thus, as can be appreciated from above, the present disclosure provides a self-aligned split gate memory cell having memory gate and select gate covered upper surfaces by some spacers. Thus the memory gate and select gate are protected from silicide. The memory gate and select gate are defined self-aligned by the said spacers. The memory gate and select gate are formed by etching back corresponding conductive materials not covered by the spacers instead of recess processes. Thus the memory gate and select gate have flat upper surfaces and are well defined. The disclosed device and method is also capable of further scaling since photolithography processes are reduced.

In some embodiments, the present disclosure relates to a split gate memory cell. The split memory cell comprises a select gate, a memory gate, a first spacer and source/drain regions. The select gate has a flat upper surface and is disposed over a semiconductor substrate, separated therefrom by a gate dielectric layer. The memory gate has a flat upper surface and is arranged at one side of the select gate, separated therefrom by a charge trapping layer. The charge trapping layer extends under the memory gate. The first spacer is disposed directly above the memory gate, separated therefrom by a first dielectric liner. The first dielectric liner extends upwardly along an upper sidewall of the charge trapping layer. The source/drain regions disposed in the semiconductor substrate at opposite sides of the select gate and the memory gate.

In other embodiments, the present disclosure relates to a pair of split gate memory cells disposed over a semiconductor substrate. The pair of split gate memory cells comprises a common source/drain region, a pair of select gates, a pair of memory gates, a pair charge trapping layers and a pair of select gate spacers. The common source/drain region is shared by first and second memory cells disposed in the semiconductor substrate. The pair of select gates corresponds to the first and second memory cells respectively arranged on opposite sides of the common source/drain region, each of the select gates having a flat upper surface. The pair of memory gates corresponds to the first and second memory cells arranged about outermost sides of the first and second select gates respectively, each of the memory gates separated from the corresponding select gates by the charge trapping layer. The charge trapping layer extends under each of the memory gates, each of the memory gates having a flat upper surface. The pair of select gate spacers is disposed directly above each of the select gates, each of the select gate spacers separated from the corresponding select gate by a select gate dielectric liner. Inner sidewalls of the select gate spacers are vertically aligned with the inner sidewalls of the corresponding select gates.

In yet other embodiments, the present disclosure relates to a method of forming a split gate memory cell with a self-aligned spacer. In this method, a semiconductor substrate including a first conductive layer with a hard mask thereover is provided. Hard mask sidewalls and first conductive layer sidewalls extend upward from an upper surface of the semiconductor substrate to an upper surface of the hard mask layer. Then a charge trapping layer is formed on the upper surface of the hard mask layer, along the hard mask sidewalls, along the first conductive layer sidewalls, and over the upper surface of the substrate. Then a second conductive layer is formed over portions of the conformal charge trapping layer which overlie the upper surface of the semiconductor substrate, whereby the second conductive layer leaves upper sidewalls of the charge trapping layer and an upper surface of the hard mask layer exposed. Then a first pair of spacers is formed along the upper sidewalls of the charge trapping layer over the second conductive layer. Then a portion of the conformal charge trapping layer and the hard mask layer is removed from between the first pair of spacers, thereby leaving upper inner sidewalls of each of the first pair of spacers exposed. Then a second pair of spacers is formed along the upper inner sidewalls of each of the first pair of spacers. Then portions of the first and second conductive layers not covered by the first and second pairs of spacers are removed, thereby forming a pair of select gates corresponding to a remaining portion of the first conductive layer and a pair of memory gates corresponding to a remaining portion of the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A split gate memory cell, comprising:
   a select gate with a planar upper surface disposed over a semiconductor substrate, separated therefrom by a gate dielectric layer;
   a memory gate with a planar upper surface arranged at one side of the select gate, separated therefrom by a charge trapping layer, wherein the charge trapping layer extends under the memory gate;
   a first spacer disposed above the memory gate, separated therefrom by a first dielectric liner, wherein the first dielectric liner comprises an upwardly-extending portion in lateral contact with an upper sidewall of the charge trapping layer; and
   source/drain regions disposed in the semiconductor substrate at opposite sides of the select gate and the memory gate.

2. The split gate memory cell of claim 1, further comprising:
   a select gate spacer disposed above the select gate, separated therefrom by a select gate dielectric liner disposed therebetween and extends upwardly along an upper sidewall of the first spacer.

3. The split gate memory cell of claim 1, further comprising:
   a second spacer disposed above the memory gate next to the first spacer, and separated from the memory gate and the first spacer by a second dielectric liner;
   wherein upper surfaces of the first and second spacers are aligned with one another.

4. The split gate memory cell of claim 3, wherein the upper surfaces of the first and second spacers are aligned with an upper surface of the select gate.

5. The split gate memory cell of claim 3, further comprising:
   a third spacer disposed along outer sidewalls of the memory gate and the select gate,
   wherein the third spacer reaches an upper surface of the semiconductor substrate and abuts sidewalls of the charge trapping layer, the memory gate and the second spacer.

6. The split gate memory cell of claim 5, wherein the third spacer abuts sidewalls of the select gate and the gate dielectric layer.

7. The split gate memory cell of claim 3, wherein the first dielectric liner and the second dielectric liner are L-shaped.

8. The split gate memory cell of claim 3, further comprising:
   a select gate spacer disposed above the select gate, and separated therefrom by a L-shaped select gate dielectric liner that extends upwardly along an upper sidewall of the first spacer;
   wherein the select gate dielectric liner abuts the charge trapping layer and the first dielectric liner.

9. The split gate memory cell of claim 1, wherein the first dielectric liner has a top surface aligned with that of the charge trapping layer.

10. A split gate memory cell, comprising:
    a select gate with a planar upper surface disposed over a semiconductor substrate, separated therefrom by a gate dielectric layer;
    a memory gate with a planar upper surface arranged at one side of the select gate, separated therefrom by a charge trapping layer, wherein the charge trapping layer extends under the memory gate;
    a first spacer disposed above the memory gate, separated therefrom by a first dielectric liner, wherein the first dielectric liner extends upwardly along an upper sidewall of the charge trapping layer;
    source/drain regions disposed in the semiconductor substrate at opposite sides of the select gate and the memory gate; and
    a second spacer disposed above the memory gate next to the first spacer, separated from the memory gate and the first spacer by a second dielectric liner;
    wherein an outer sidewall of the second spacer is aligned with that of the memory gate.

11. The split gate memory cell of claim 10, wherein the first and second spacers comprise silicon nitride and the first and second dielectric liners comprise silicon dioxide.

12. The split gate memory cell of claim 10, further comprising:
    a third spacer disposed along outer sidewalls of the memory gate and the select gate.

13. The split gate memory cell of claim 10, wherein a height of the select gate is larger than that of the memory gate.

14. A pair of split gate memory cells disposed over a semiconductor substrate, comprising:
    a common source/drain region shared by the pair of memory cells disposed in the semiconductor substrate;
    a pair of select gates corresponding to the pair of memory cells respectively arranged on opposite sides of the common source/drain region, each of the select gates having a planar upper surface;
    a pair of memory gates corresponding to the pair of memory cells arranged about outermost sides of the pair of select gates respectively, each of the memory gates separated from the corresponding select gates by a charge trapping layer, wherein the charge trapping layer extends under each of the memory gates, each of the memory gates having a planar upper surface;
    a pair of select gate spacers disposed above the select gates, each of the select gate spacers separated from the corresponding select gate by a select gate dielectric liner; and
    wherein inner sidewalls of the select gate spacers are vertically aligned with the inner sidewalls of the corresponding select gates.

15. A pair of split gate memory cells disposed over a semiconductor substrate, comprising:
    a common source/drain region shared by the pair of memory cells disposed in the semiconductor substrate;
    a pair of select gates corresponding to the pair of memory cells respectively arranged on opposite sides of the common source/drain region, each of the select gates having a planar upper surface;
    a pair of memory gates corresponding to the pair of memory cells arranged about opposite sides of the pair of select gates respectively, the memory gates separated from the corresponding select gates by a charge trapping layer, wherein the charge trapping layer extends under each of the memory gates, each of the memory gates having a planar upper surface;
    a first pair of spacers respectively disposed above the pair of memory gates and along an upper sidewall of the charge trapping layer; and
    a first dielectric liner to cover a bottom surface and a sidewall surface of the first pair of spacers.

16. The split gate memory cell of claim 15, further comprising:
    a second pair of spacers respectively disposed above the pair of memory gates and next to the first pair of spacers, and separated from the first pair of spacers by a second dielectric liner, wherein the second dielectric liner covers a bottom surface of the second pair of spacers.

17. The split gate memory cell of claim 16, further comprising:
a third pair of spacers disposed along outer sidewalls of the memory gates and the select gates,
wherein the third pair of spacers cover sidewall surfaces of the select gates and memory gates.

18. The split gate memory cell of claim 16, wherein outer sidewalls of the second pair of spacers are vertically aligned with the outer sidewalls of the corresponding memory gates.

19. The split gate memory cell of claim 16, wherein upper surfaces of the first and second pairs of spacers are laterally aligned with the planar upper surfaces of the corresponding select gates.

20. The split gate memory cell of claim 16, further comprising:
a pair of select gate spacers respectively disposed above the corresponding select gates, and separated therefrom by a L-shaped select gate dielectric liner that extends upwardly along upper sidewalls of the first pair of spacers;
wherein the pair of select gate spacers respectively have inner sidewalls and bottom surfaces covered by the select gate dielectric liner and outer sidewalls aligned with that of the corresponding select gates.

* * * * *